US012699007B2

(12) United States Patent
Kupper et al.

(10) Patent No.: US 12,699,007 B2
(45) Date of Patent: Aug. 4, 2026

(54) PASSIVE PYROELECTRIC INFRARED SENSOR WITH SENSOR ELEMENTS ON A SINGLE CRYSTAL

(71) Applicant: Excelitas Technologies Singapore Pte. Ltd., Singapore (SG)

(72) Inventors: Hendrik Kupper, Frankfurt (DE); Henrik Ernst, Katzenelnbogen (DE); Dirk Steigel, Wiesbaden (DE)

(73) Assignee: Excelitas Technologies Singapore Pte. Ltd., Singapore (SG)

( * ) Notice: Subject to any disclaimer, the term of this patent is extended or adjusted under 35 U.S.C. 154(b) by 158 days.

(21) Appl. No.: 18/821,001

(22) Filed: Aug. 30, 2024

(65) Prior Publication Data

US 2025/0085168 A1 Mar. 13, 2025

Related U.S. Application Data

(60) Provisional application No. 63/582,068, filed on Sep. 12, 2023.

(51) Int. Cl.
*G01J 5/35* (2022.01)
*H10N 15/10* (2023.01)

(52) U.S. Cl.
CPC ................ *G01J 5/35* (2022.01); *H10N 15/15* (2023.02)

(58) Field of Classification Search
CPC ............... G01J 5/35; G01J 5/0853; G01J 5/34
See application file for complete search history.

(56) References Cited

U.S. PATENT DOCUMENTS 5,159,936 A 11/1992 Yelderman et al.
2013/0230074 A1 9/2013 Shin

FOREIGN PATENT DOCUMENTS

| CN | 101246055 A | * | 8/2008 |
| JP | H05-50329 U | | 7/1993 |
| JP | H09218086 A | * | 8/1997 |
| KR | 100741863 B1 | | 7/2007 |

OTHER PUBLICATIONS

International Search Report and Written Opinion mailed Jan. 2, 2025 in connection with International Application No. PCT/SG2024/050567.

* cited by examiner

*Primary Examiner* — Casey Bryant

(74) *Attorney, Agent, or Firm* — Wolf, Greenfield & Sacks, P.C.

(57) ABSTRACT

Described herein are techniques for reducing spike noise arising in pyroelectric infrared sensors due to charge build up. The sensors developed by the inventors and described herein rely on the use of dummy elements positioned to prevent or limit charge build-up in the unused space. A first sensing element comprises a first portion of the first layer of conductive material, a first portion of the layer of pyroelectric material, a first portion of the second layer of conductive material and a first absorption region coupled to the first portion of the first layer of conductive material. A dummy element comprises a second portion of the first layer of conductive material, a second portion of the layer of pyroelectric material and a second portion of the second layer of conductive material. The first layer of conductive material defines a first gap between the first portion of the first layer of conductive material and the second portion of the first layer of conductive material.

20 Claims, 7 Drawing Sheets

PASSIVE PYROELECTRIC INFRARED SENSOR WITH SENSOR ELEMENTS ON A SINGLE CRYSTAL

RELATED APPLICATIONS

This application claims the benefit under 35 U.S.C. § 119(e) of U.S. Provisional Application Ser. No. 63/582,068, filed Sep. 12, 2023, and titled "PASSIVE PYROELECTRIC INFRARED SENSOR WITH MULTIPLE SENSOR ELEMENTS ON A SINGLE CRYSTAL," which is hereby incorporated herein by reference in its entirety.

BACKGROUND

The pyroelectric effect is a phenomenon that certain materials exhibit whereby they generate an electric charge difference or voltage when subjected to temperature changes. When the temperature of the pyroelectric material changes, it causes the lattice structure of the material to deform or undergo a shift in its charge distribution. This change in charge distribution leads to the generation of an electric potential gradient across the material due to a change in polarization.

SUMMARY

Some embodiments relate to a pyroelectric sensor comprising a layer of pyroelectric material having a first surface and a second surface opposite the first surface; a first layer of conductive material coupled to the first surface of the layer of pyroelectric material, and a second layer of conductive material coupled to the second surface of the layer of pyroelectric material; a first sensing element comprising a first portion of the first layer of conductive material, a first portion of the layer of pyroelectric material, a first portion of the second layer of conductive material, and a first absorption region coupled to the first portion of the first layer of conductive material; and a dummy element comprising a second portion of the first layer of conductive material, a second portion of the layer of pyroelectric material and a second portion of the second layer of conductive material, wherein the first layer of conductive material defines a first gap between the first portion of the first layer of conductive material and the second portion of the first layer of conductive material.

In some embodiments, the dummy element has a reflective top surface, the top surface of the dummy element being opposite the first surface of the layer of conductive material relative to the dummy element.

In some embodiments, the dummy element surrounds the first sensing element.

In some embodiments, the second portion of the first layer of conductive material is electrically shorted to the second portion of the second layer of conductive material.

In some embodiments, the second portion of the first layer of conductive material and the second portion of the second layer of conductive material are connected to a discharge path.

In some embodiments, the layer of pyroelectric material comprises Lithium Tantalate, Lithium Niobate or polyvinylidene fluoride.

In some embodiments, the layer of pyroelectric material has a resistivity greater than $10^{10}$ $\Omega$-m.

In some embodiments, the first gap separates the first portion of the first layer of conductive material from the second portion of the first layer of conductive material by 25 $\mu$m-500 $\mu$m.

In some embodiments, the pyroelectric sensor further comprises read-out circuitry coupled to the first portion of the first layer of conductive material and the first portion of the second layer of conductive material.

In some embodiments, the pyroelectric sensor further comprises a second sensing element comprising a third portion of the first layer of conductive material, a third portion of the layer of pyroelectric material, a third portion of the second layer of conductive material and a second absorption region coupled to the third portion of the first layer of conductive material, wherein the first layer of conductive material further defines a second gap between the third portion of the first layer of conductive material and the second portion of the first layer of conductive material.

In some embodiments, the dummy element surrounds both the first and second sensing elements.

In some embodiments, the second layer of conductive material defines a third gap between the first portion of the second layer of conductive material and the second portion of the second layer of conductive material.

In some embodiments, the dummy element further comprises a second absorption region coupled to the second portion of the first layer of conductive material, wherein the second portion of the first layer of conductive material is electrically shorted to the second portion of the second layer of conductive material.

Some embodiments relate to a pyroelectric sensor comprising a layer of pyroelectric material having a first surface and a second surface opposite the first surface; a first layer of conductive material coupled to the first surface of the layer of pyroelectric material, and a second layer of conductive material coupled to the second surface of the layer of pyroelectric material; a first sensing element comprising a first portion of the first layer of conductive material, a first portion of the layer of pyroelectric material, a first portion of the second layer of conductive material, and a first absorption region coupled to the first portion of the first layer of conductive material; a second sensing element comprising a second portion of the first layer of conductive material, a second portion of the layer of pyroelectric material, a second portion of the second layer of conductive material and a second absorption region coupled to the second portion of the first layer of conductive material; and a dummy element enclosing both the first portion of the first layer of conductive material and the second portion of the first layer of conductive material.

In some embodiments, the dummy element has a reflective top surface, the reflective top surface of the dummy element being opposite the first surface of the layer of conductive material relative to the dummy element.

In some embodiments, the dummy element comprises a third portion of the first layer of conductive material, a third portion of the layer of pyroelectric material and a third portion of the second layer of conductive material.

In some embodiments, the third portion of the first layer of conductive material and the third portion of the second layer of conductive material is connected to a discharge path.

In some embodiments, the pyroelectric sensor further comprises a second dummy element disposed between the first portion of the second layer of conductive material and the second portion of the second layer of conductive material.

In some embodiments, the dummy element further comprises a third absorption region coupled to the third portion of the first layer of conductive material, wherein the third portion of the first layer of conductive material is electrically shorted to the second portion of the second layer of conductive material.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in the figures in which they appear.

DETAILED DESCRIPTION

I. Pyroelectric Infrared Sensors

Figure 1:
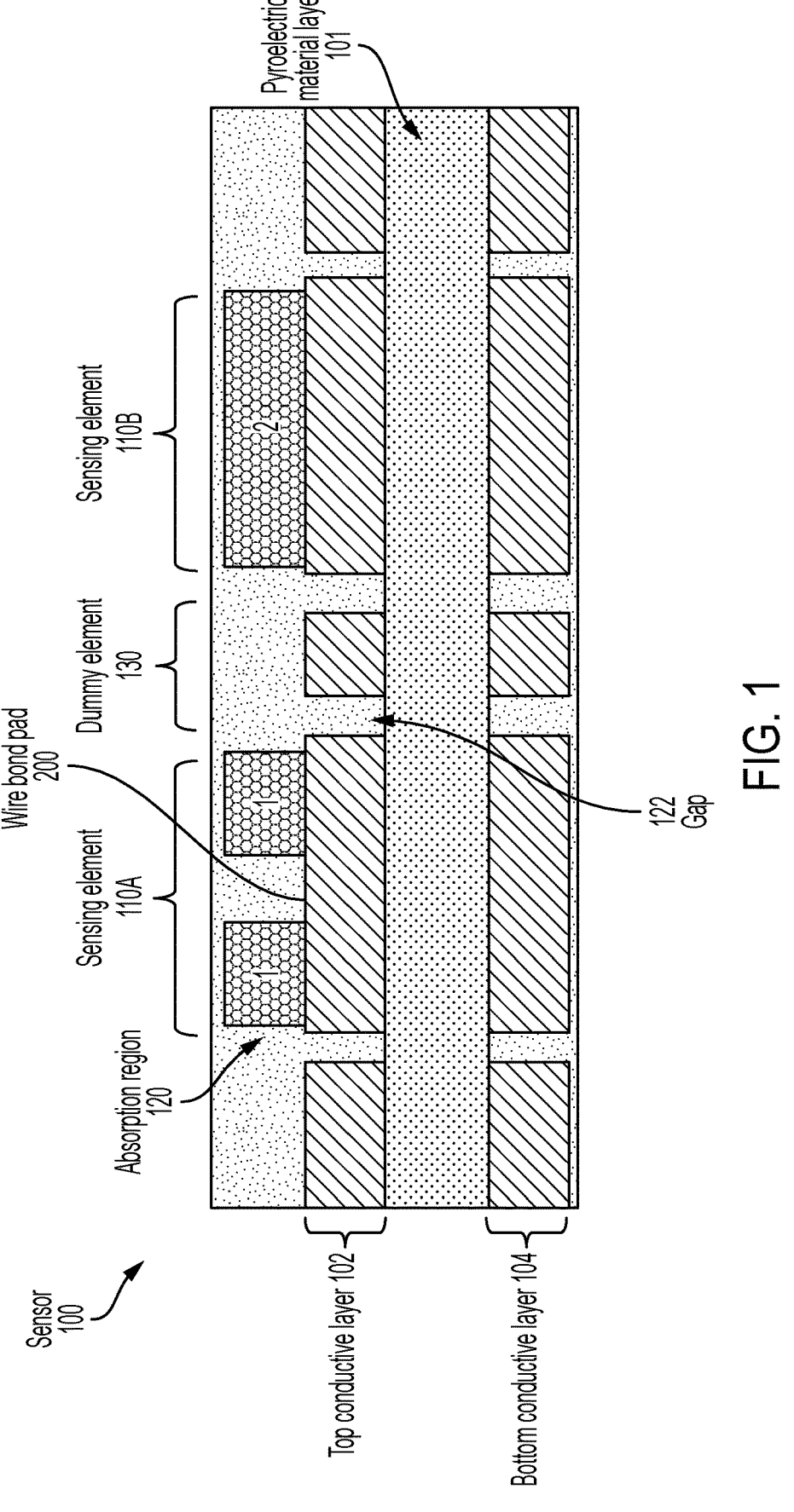
FIG. 1 is a cross sectional view of an infrared sensor with a reflective dummy element, in accordance with some embodiments of the present disclosure.

Described herein are techniques for reducing spike noise arising in pyroelectric infrared sensors due to charge build-up. Pyroelectric infrared sensors, often referred to as pyroelectric sensors or PIR (Passive Infrared) sensors, are electronic devices that detect changes in infrared radiation emitted by warm objects. These sensors are widely used for gas sensing, motion detection, security systems, automatic lighting control, and other applications where the presence or movement of warm bodies or objects needs to be detected without emitting any radiation by the detector (e.g., using passive detectors). Pyroelectric sensors are made from pyroelectric materials, which exhibit a unique property-they generate an electrical charge when exposed to temperature variations. These materials have a crystal lattice structure that changes polarization when there is a temperature change, resulting in the generation of an electric charge. Pyroelectric materials may include, but are not limited to, Lead Zirconate Titanate, Lithium Tantalate, Lithium Niobate, and/or polyvinylidene fluoride.

Pyroelectric sensors used for gas sensing are typically designed to detect specific gases or volatile organic compounds (VOCs) present in the environment. These sensors operate based on the principle that certain gases absorb infrared radiation at specific wavelengths. The sensor's design includes an optical filter with a coating that filters all but the desired wavelengths of the gas or VOC. The amount of unfiltered IR-radiation changes depending upon the concentration of the target gases, result in a temperature change in the pyroelectric material. This allows a quantitative gas sensing.

Pyroelectric sensors used for motion detection, often found in security systems or automatic lighting, are designed to detect changes in infrared radiation caused by moving objects or individuals. These sensors can detect any warm-bodied object or individual that enters their field of view. These sensors often include multiple elements (pixels) arranged in an array, and each pixel contains a pyroelectric element. These sensors may alternatively or additionally include a single element (pixel) containing a pyroelectric element. When a warm-bodied object moves across the sensor's field of view, it generates a temporary temperature change on the pixels. This temperature change produces an electrical signal that is detected by the sensor, triggering an appropriate response such as activating an alarm or turning on lights.

Using an array of pixels for motion detection offers several benefits. It allows for wider coverage, reducing blind spots and increasing the overall accuracy of detecting moving objects. Multiple sensors can be strategically positioned to provide better spatial awareness, detecting motion from different angles and directions. Arrays can also enable more advanced motion detection algorithms, such as tracking the movement trajectory or distinguishing between different types of motion or warm-bodied objects.

II. Choice of Pyroelectric Materials

RoHS (Restriction of Hazardous Substances) is a directive adopted by the European Union that restricts the use of certain hazardous substances in electrical and electronic equipment. The restricted substances under RoHS include lead (Pb), mercury (Hg), cadmium (Cd), hexavalent chromium (CrVI), polybrominated biphenyls (PBB), and polybrominated diphenyl ethers (PBDE). Similar restrictions have been adopted in other countries.

Lead Zirconate Titanate (PZT) is a widely used pyroelectric material with excellent properties for infrared detection. However, PZT contains lead, which is one of the restricted substances under RoHS. While some manufacturers have developed lead-free alternatives to PZT, traditional PZT-based sensors might not be RoHS compliant. The pyroelectric infrared sensors developed by the inventors and described herein do not contain lead and are RoHS compliant.

Lithium Tantalate (LiTaO3) is a pyroelectric material that is particularly suitable for use in infrared sensors because it is lead-free and presents high resistivity, in the order of $1.1 \times 10^{11}$ Ω-m. High resistivity is desirable in infrared detection because it enhances the sensitivity of the sensor. The sensitivity of a pyroelectric infrared sensor refers to its ability to detect and respond to changes in infrared radiation. It is a measure of how well the sensor can convert variations in infrared radiation into electrical signals. Sensitivity is a crucial parameter for pyroelectric sensors, as it directly affects their performance in detecting small temperature changes caused by moving objects or other sources of infrared radiation. The sensitivity of a pyroelectric infrared sensor is typically specified in units of volts per watt (V/W) or volts per degree Celsius (V/° C.). The voltage produced in response to detection of infrared detection, in turn, is given by the product of the current (I) flowing through the sensor and the resistance (R) of the sensor. Thus, the higher the resistivity, the higher the resistance and, consequently, the higher the voltage (given a certain amount of infrared radiation).

Lithium Tantalate presents an additional advantage. Relative to other materials, it has a more stable resistivity over a variety of temperatures. This allows a broader temperature operating range and/or a more constant response at various ambient temperatures.

Lithium Niobate (LiNbO3) is another lead-free pyroelectric material that exhibits high resistivity, in the order of $2 \times 10^{12}$ $\Omega$-m. Another pyroelectric material is polyvinylidene fluoride (PVDF), having a resistivity of $1.5 \times 10^{12}$ $\Omega$-m. More generally, some embodiments of the infrared sensors described herein employ lead-free pyroelectric materials having resistivities in excess of $10^{10}$ $\Omega$-m or in excess of $10^{11}$ $\Omega$-m.

The inventors have further recognized and appreciated that using single-crystal sensors presents several benefits. Forming multiple pyroelectric sensing elements on a common piece of pyroelectric material reduces manufacturing costs, increases compactness, and leads to a more uniform thermal contact relative to implementations where sensing elements are formed on separate pieces of pyroelectric material.

III. Spike Noise

While the high resistivities of the materials discussed above make them particularly suitable candidates for infrared detection, high resistivity presents a challenge-spike noise. Spike noise results from the build-up of electric charge in high resistivity materials when exposed to temperature variations. As the voltage increases, the volume surrounding the device ionizes, and electric sparks can occur. Electric sparks can negatively affect the sensor's ability to sense infrared radiation, thus resulting in noise. Additionally, if sufficiently high in magnitude, electric sparks can permanently damage the sensing elements or the read-out circuitry. For particularly sensitive sensors, changes in the ambient temperature alone can cause electric sparks even in the absence of infrared radiation caused by movement of objects or by the presence of gas.

The negative effects of spike noise are particularly severe in infrared sensors used for motion detection. As noted above, infrared sensors used for motion detection often use multiple sensing elements (pixels) to provide wider coverage. Unfortunately, the space that exists between adjacent pixels is susceptible to charge build-up, which increases the likelihood of electric sparks, and thus inaccurate measurements and/or damaged equipment.

IV. Low-Spike Noise Infrared Sensors

The inventors have developed lead-free, high-resistivity, pyroelectric infrared sensors that reduce spike noise. The sensors developed by the inventors and described herein rely on the use of dummy elements positioned to prevent or limit charge build-up in the space around and/or between adjacent pixels for multi-pixel pyroelectric infrared sensors or around the pixel in single-pixel pyroelectric infrared sensors. In some embodiments, these sensors use single-crystal pyroelectric materials, which allows the integration of multiple pyroelectric sensing elements on a common piece of pyroelectric material.

The dummy elements described herein are elements that can be formed alongside the sensing elements, but that provide a different function. Sensing elements are elements that produce signals that depend upon the amount of infrared radiation hitting the device-those signals are ultimately digitized and processed to produce outputs that are indicative of the amount of infrared radiation. In that regard, sensing elements can be viewed as pixels of an infrared sensor. On the other hand, dummy elements are elements that occupy the space that would otherwise remain unoccupied by the sensing elements, and that limit charge build-up. Dummy elements should not be considered as pixels in that they may not contribute to the infrared sensing and associated outputs. In that regard, dummy elements can be viewed as passive elements. The passive nature of a dummy element can be achieved in different ways. For example, a passive dummy element may include reflective material (e.g., gold) thereby reflecting infrared radiation (instead of absorbing it as is the case for sensing elements). Alternatively, a dummy element may include absorptive material (e.g., photoresist and/or graphite), but electric charge produced through absorption of infrared radiation does not contribute to the output of the sensor (e.g., may not be digitized or processed to produce an output that is indicative of the amount of absorbed infrared radiation). In some embodiments, whether reflective or absorptive, a dummy element may be shorted to ground or to another discharge path (instead of being connected to an analog-to-digital converter as may be the case for sensing elements), thereby discharging any electric charge.

FIG. 1 presents an example of a reflective dummy element. FIG. 1 is a cross sectional view of an infrared sensor in accordance with some embodiments of the present disclosure. FIG. 1 is taken along the AA line of FIG. 2. In this implementation, sensor 100 includes a layer of pyroelectric material 101, a plurality of sensing elements 110 (two in this example, 110A and 110B, although any other number of elements is possible) and dummy element 130. The pyroelectric material forming layer 101 may be made of (or otherwise include) Lithium Tantalate, Lithium Niobate, polyvinylidene fluoride, or any other suitable lead-free material having a large resistivity (e.g., in excess of $10^{10}$ $\Omega$-m). Notably, the sensing elements 110 of sensor 100 share the same piece of pyroelectric material.

A pair of layers of conductive materials are formed on either side of the pyroelectric material layer 101. Top conductive layer 102 is formed on the top side of layer 101 and bottom conductive layer 104 is formed on the bottom side of layer 101. Conductive layers 102 and 104 may be made of (or otherwise include) gold, although other conductive materials are also possible. In this implementation, the sensing elements 110 include respective portions of the top conductive layer 102 (although sensing elements alternatively or additionally be included on respective portions of the bottom conductive layer 104). Each sensing element includes a portion of top conducive layer 102 that is separate from the portions of the top conductive layer defining the other sensing elements. This can be achieved by etching the conductive material in the regions between adjacent sensing elements. As a result, each sensing element can operate as a pixel, such that the infrared radiation sensed by one pixel is independent from the infrared radiation sensed by another pixel. Absorption regions 120 are formed on top of the region of the top conductive layer 102 that is part of the sensing elements 110. In this implementation, each sensing element 110 includes two absorption regions 120 (although any other number of absorption regions is possible). Sensing element 110A includes the absorption regions 120 labelled "1" and "1," with a gap in between to provide access to the top conductive layer via wire bond pad 200. These absorption regions 120 are connected to each other around the wire bond pad 200 and are connected to the same portion of the top conductive layer 102. Sensing element 110B includes the absorption region labelled "2" and is connected to a separation portion of the top conductive layer 102 relative to sensing element 110A.

The absorption regions are made of (or otherwise include) a material that absorbs infrared radiation. As an example, the absorption regions may be implemented as dark photoresist, although conventional photoresist may be used in some embodiments. Therefore, when infrared radiation hits a sensing element, photons are absorbed by the absorption regions, leading to a temperature change in the sensing element. This, through the pyroelectric effect, creates a charge difference between the top and bottom surfaces of the pyroelectric material layer 101. Being made of pyroelectric material, layer 101 responds to the temperature differential by generating an electric potential differential between the top and bottom conductive layers. By determining this voltage, the sensor can infer the amount of infrared radiation to which the sensing element is exposed (e.g., in watts) and/or the temperature differential existing between the top and bottom surface of layer 101.

Top conductive layer 102 further defines a dummy element 130 positioned in the region between adjacent sensing elements 110A and 110B (although dummy elements may alternatively or additionally be positioned in the region between adjacent sensing elements of bottom conductive layer 104). Similar to sensing elements 110A and 110B, dummy element 130 may be defined by etching the top and bottom conductive layers. Gaps 122 are defined as discontinuities in a conductive layer (e.g., top layer 102 or bottom layer 104). For example, a gap 122 may form a region between dummy element 130 and the adjacent sensing element 110. Gaps 122 may alternatively or additionally form a region between a first dummy element 130 and a second dummy element 130. Gaps 122 may alternatively or additionally form a region between a first sensing element 110 and a second sensing element 110. Gaps 122 may alternatively or additionally form a region between a first portion of the top conductive layer 102 and a second portion of the top conductive layer 102. Gaps 122 may alternatively or additionally form a region between a first portion of the bottom conductive layer 104 and a second portion of the bottom conductive layer 104. Gaps 122 may be filled with (or otherwise include) photo resistive material, absorptive material or any other suitable non-conductive material. Unlike the sensing elements, however, dummy element 130 lacks absorption regions 120 formed thereon. As a result, the top surface of the dummy element is reflective to infrared radiation. Given the conductive nature of layer 102, the presence of dummy element 130 prevents or limits charge build-up that may otherwise arise had the space between the sensing elements been entirely filled with a dielectric material (e.g., air). In the example of FIG. 1, instead of having charge build-up in the entire region between adjacent pixels, charge accumulates only inside gaps 122. Less charge build-up translates into lower spike noise. The size of the gaps 122 may be between 25 μm and 1 mm, between 25 μm and 500 μm, between 25 μm and 400 μm, between 25 μm and 300 μm, between 25 μm and 200 μm, between 25 μm and 100 μm, between 25 μm and 50 μm, between 50 μm and 1 mm, between 50 μm and 500 μm, between 50 μm and 400 μm, between 50 μm and 300 μm, between 50 μm and 200 μm, between 50 μm and 100 μm, between 100 μm and 1 mm, between 100 μm and 500 μm, between 100 μm and 200 μm, between 100 μm and 300 μm, or between 100 μm and 400 μm. The lower end of the range may be dictated by the spatial resolution available as part of photolithographic process. On the other hand, the upper end of the range may be set to limit the overall charge build-up, since the larger the gap, the greater the charge build-up.

In some embodiments, in order to limit charge build-up in the portion of layer 101 that is part of the dummy element, the portion of layer 102 that forms part of the dummy element and the portion of the layer 104 that forms part of the dummy element are electrically shorted to each other, and optionally, are electrically connected to ground.

Figure 2:
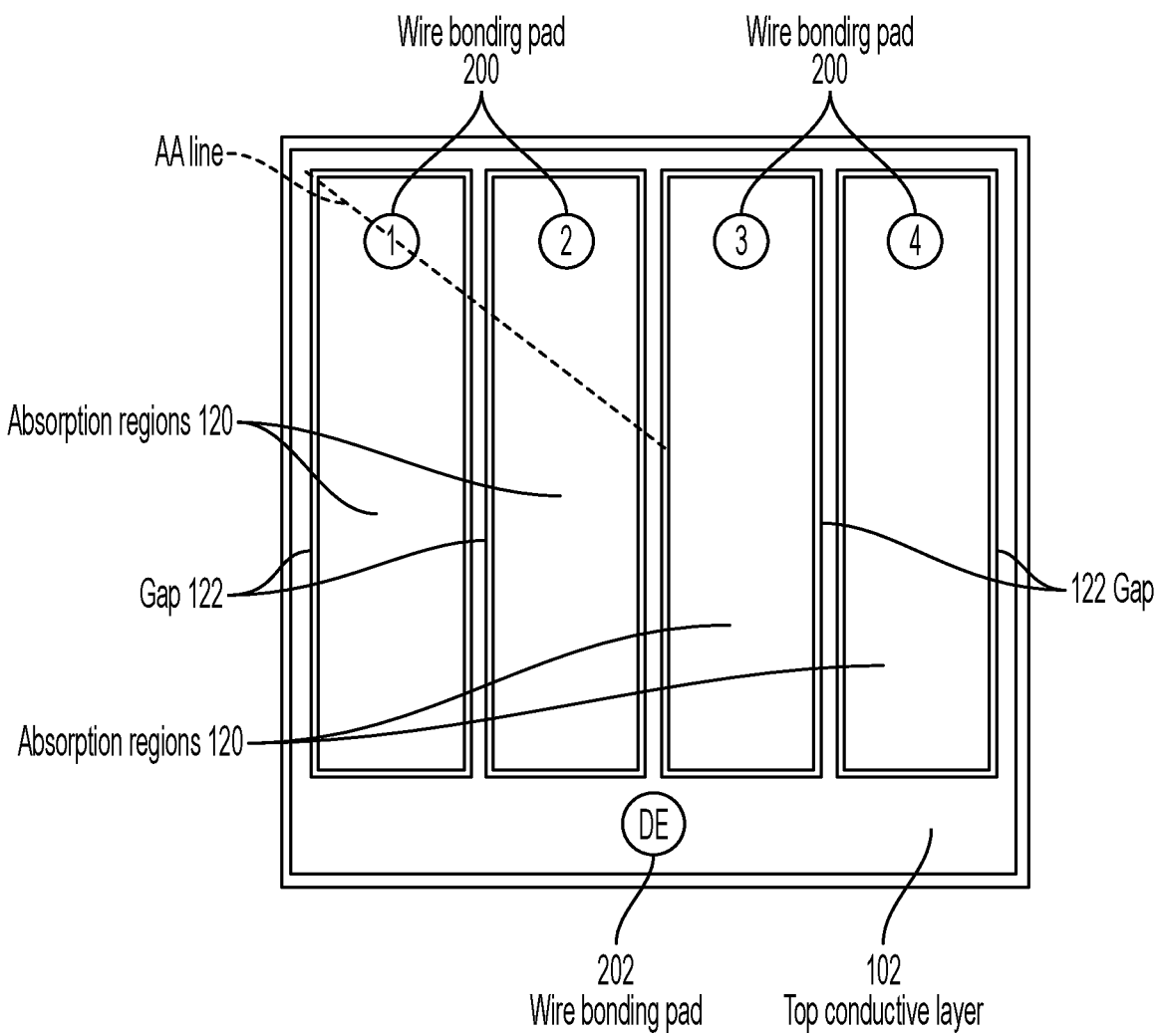
FIG. 2 is a top view of the sensor of FIG. 1, in accordance with some embodiments of the present disclosure.

FIG. 2 is a top view of sensor 100, in accordance with some embodiments of the present disclosure. This view illustrates the absorption regions 120 disposed on a top conductive layer 120 and gaps 122 surrounding each respective absorption region 120. Portions of the absorption regions are etched away to form bonding pads 200, labelled "1," "2," "3," and "4," exposing regions of conductive material that can serve as landing areas for wire bonding. A wire bonding pad 202, labeled "DE," is also defined in a region of top conductive layer 102 providing a wire landing area for the dummy element 130. Bonding pad 202 can enable connection to ground or to another discharge path.

In the example of FIG. 2, all the surface of top conductive layer 102 that is not covered by absorption regions 120 defines a super dummy element. This super dummy element encloses the sensing elements on all sides, creating islands of absorption regions completely surrounded by a sea of non-absorbing material (e.g., reflective). This arrangement may produce a 2-dimensional Faraday cage and may reduce crosstalk between the pixels. Further, it can provide the additional benefit of shielding the sensor from electromagnetic interference, (EMI) or radio-frequency interference (RFI).

A possible alternative to the super dummy element includes a set of discrete dummy elements that are electrically connected to one another by bond wires or other types of electrical connections. Each one of the discrete dummy elements may be positioned in the space between a respective pair of sensing elements 110.

Figure 3:
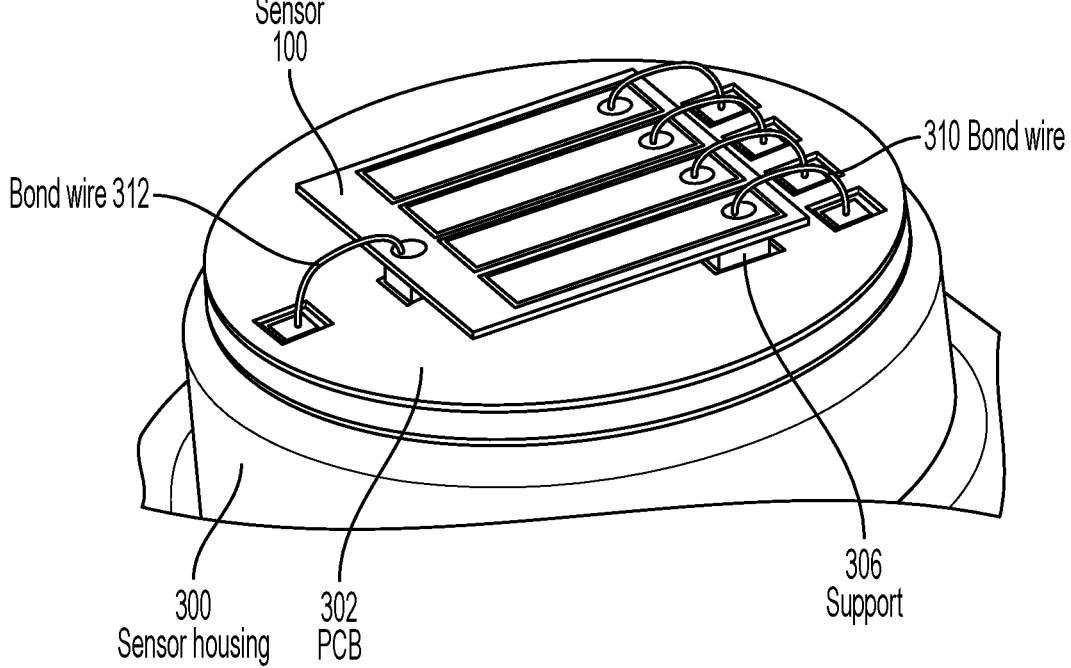
FIG. 3 illustrates the sensor of FIG. 1 when packaged, in accordance with some embodiments of the present disclosure.

In the depiction of FIG. 3, sensor 100 is disposed on a printed circuit board (PCB) 302, mounted on a sensor housing 300. Bond wires 310 connect the sensing elements to read-out circuitry formed on, or outside, PCB 302. Bond wire 312 connects top conductive layer 102 to ground or to another fixed potential. Supports 306 raise sensor 100 above the plane of PCB 302 and connects the bottom side of the sensing elements with the PCB 302.

Figure 4:
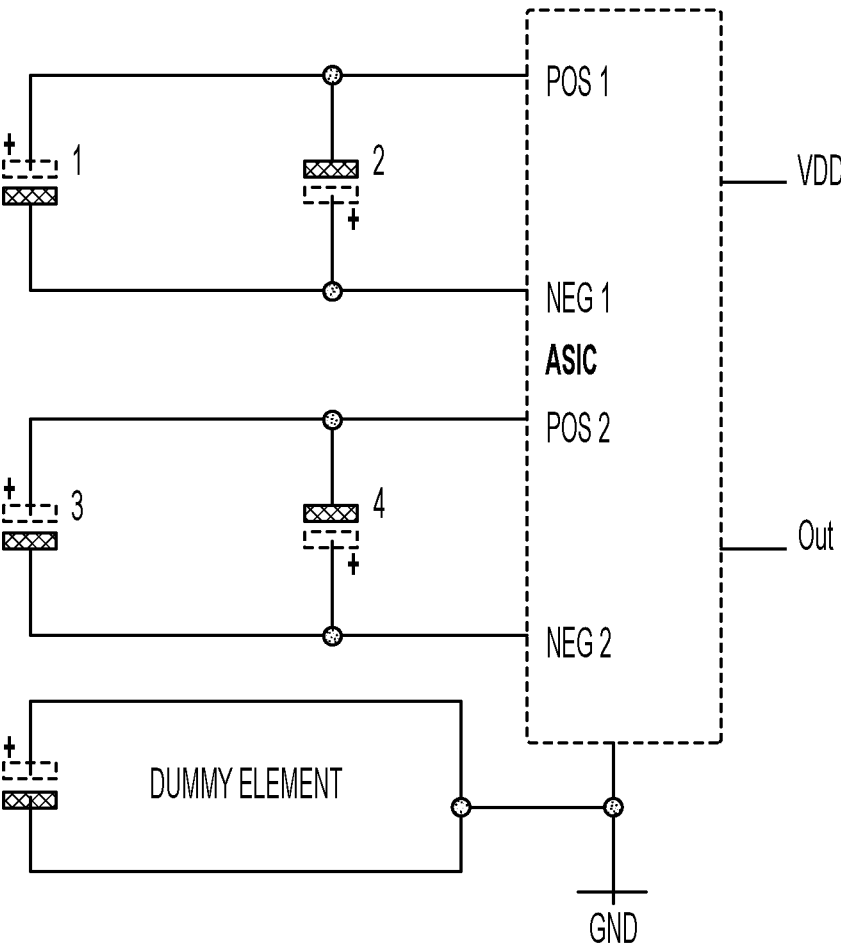
FIG. 4 is an electric circuit illustrating the electric operation of the multi-pixel sensor of FIG. 2, in accordance with some embodiments of the present disclosure.

FIG. 4 is an electric circuit illustrating the electric operation of the multi-pixel sensor of FIG. 2, in accordance with some embodiments of the present disclosure. In this circuit diagram, the sensing elements are modeled as polarized capacitors. The voltages produced by the capacitors in response to temperature differentials across pyroelectric material layer 101 are read by a read-out circuit, formed by an ASIC in this case. The "Out" terminal of the ASIC may produce a voltage and/or a current (in the case of an analog circuit) or a value (in the case of a digital circuit) that is indicative of the power of the infrared radiation sensed by sensor 100 and/or the temperature differential across layer 101. The "Vdd" terminal may indicate a connection towards the supply voltage to power the ASIC. The capacitor labelled "dummy element" represents the capacitor formed by the dummy element. As shown, both the terminals of this capacitor are shorted to ground in this example. In the example of FIG. 1, the dummy element is implemented as a reflective element, given the absence of an absorption region on top of the dummy element. However, dummy elements of the types described herein may alternatively be implemented to be absorptive, although electric charge produced through absorption of infrared radiation does not contribute to the output of the sensor (e.g., may not be digitized or processed to produce an output that is indicative of the amount of absorbed infrared radiation).

Figure 5:
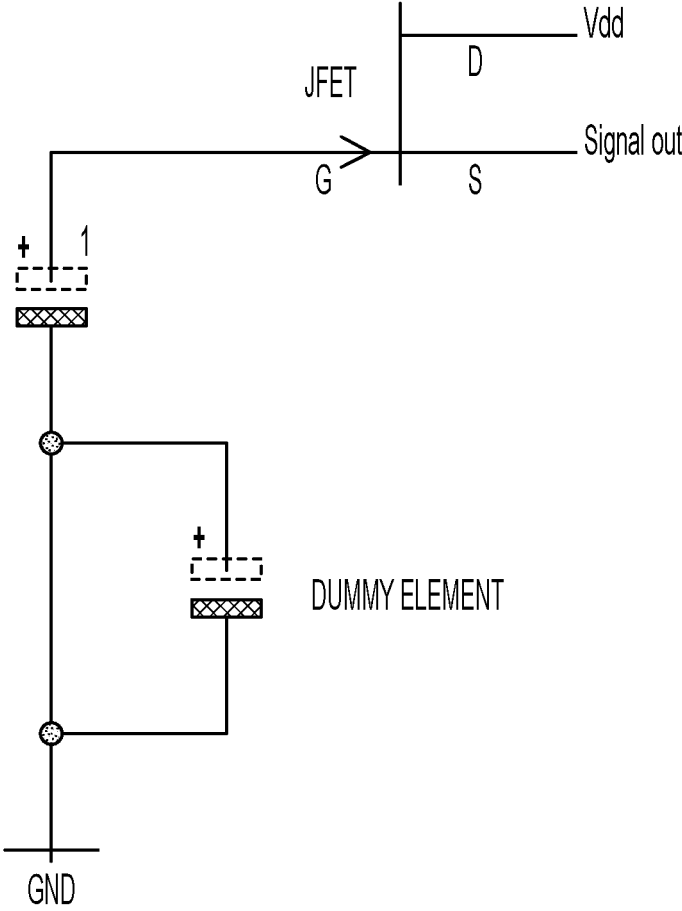
FIG. 5 is an electric circuit illustrating the electrical operation of a single-pixel analog sensor, in accordance with some embodiments of the present disclosure.

FIG. 5 is an electric circuit illustrating the electrical operation of a single-pixel analog sensor, in accordance with some embodiments of the present disclosure. In this circuit diagram, there may be only one sensing element, an ASIC (containing a JFET in this example), and a dummy element connect to ground GND. The "Out" terminal of the JFET produces a voltage and/or a current that is indicative of the power of the infrared radiation sensed by sensor 100 and/or the temperature differential across layer 101.

Figure 6A:
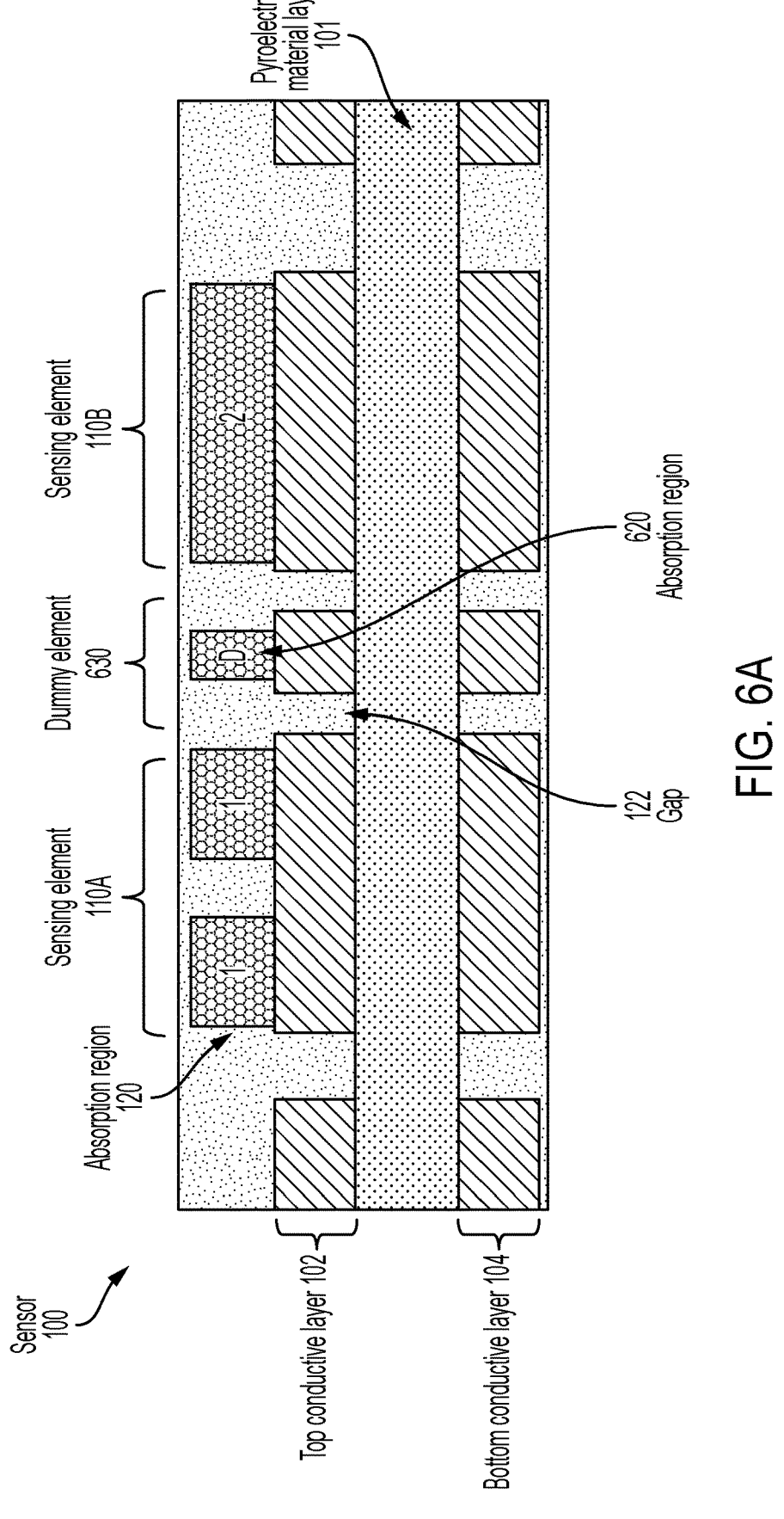
FIG. 6A is a cross sectional view of an infrared sensor with an absorptive dummy element, in accordance with some embodiments of the present disclosure.
Figure 6B:
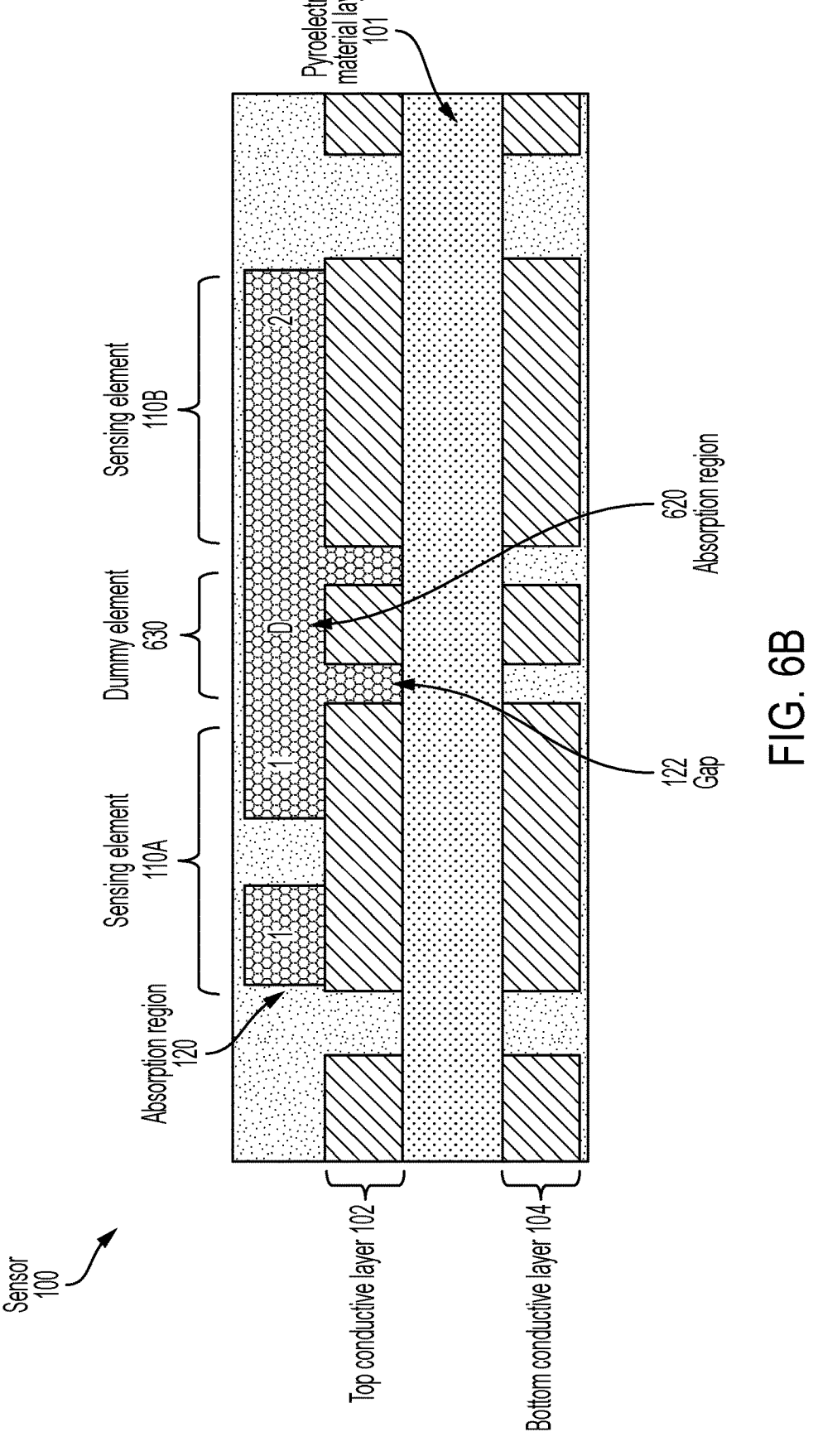
FIG. 6B is a cross sectional view of an infrared sensor with an absorptive dummy element, in accordance with some embodiments of the present disclosure.

FIGS. 6A and 6B depict a cross sectional view of an infrared sensor with an absorptive dummy element 630, in accordance with some embodiments of the present disclosure. The device of FIGS. 6A and 6B is similar to the device of FIG. 1, but dummy element 630 in FIGS. 6A and 6B, is absorptive instead of being reflective, given the presence of absorption region 620, labelled "D." Absorption region 620 may be made of any of the materials described above in connection with absorption region 120. Top conductive layer 102 further defines a dummy element 630 and an absorption region 620 positioned in the region between adjacent sensing elements 110A and 110B. Dummy element 630 and absorption region 620 may alternatively or additionally be positioned in the region between adjacent sensing elements of bottom conductive layer 104. Alternatively or additionally, absorption region 620 may fill gaps 122. As in the example of FIG. 6B, absorption region 620 may be between positioned between sensing elements 110A and 110B and also may extend to fill gaps 122 between sensing elements 110A and 110B. In this example of FIG. 6B, absorption region 620 may alternatively or additionally extend into a region of gaps 122. Electric charge produced by dummy element 630 through absorption of infrared radiation may be discharged in various ways (without contributing to the sensor output). As described in connection with FIG. 2, for example, dummy element 630 may be connected to ground or to another discharge path (e.g., via wire bonding or other means) instead of being connected to an analog-to-digital converter as may be the case for the sensing elements 110, thereby discharging any electric charge. As in the example of FIG. 2, all the surface of top conductive layer 102 that is not part of any sensing elements may define a super dummy element. This super dummy element encloses the sensing elements, creating islands defining sensing elements. In some embodiments, portions of the super dummy element may be reflective and portions of the supper dummy may be absorptive.

In some embodiments, to further limit charge build-up in the portion of layer 101 that is part of dummy element 630, the portion of layer 102 that forms part of the dummy element and the portion of the layer 104 that forms part of the dummy element are electrically shorted to each other.

Accordingly, some embodiments relate to a pyroelectric sensor having a layer of pyroelectric material, a first layer of conductive material and a second layer of conductive material. The layer of pyroelectric material has a first surface and a second surface opposite the first surface. The first layer of conductive material is coupled (e.g., directly or through an intervening layer) to the first surface of the layer of pyroelectric material. The second layer of conductive material is coupled to the second surface of the layer of pyroelectric material. A first sensing element includes a first portion of the first layer of conductive material, a first portion of the layer of pyroelectric material, a first portion of the second layer of conductive material and a first absorption region (e.g., labelled "1" in FIG. 1) coupled to the first portion of the first layer of conductive material. A dummy element includes a second portion of the first layer of conductive material, a second portion of the layer of pyroelectric material and a second portion of the second layer of conductive material. The first layer of conductive material defines a first gap between the first portion of the first layer of conductive material and the second portion of the first layer of conductive material. In some embodiments, the dummy element has a reflective top surface, where the top surface of the dummy element is opposite the first surface of the layer of conductive material relative to the dummy element. In some embodiments, the dummy element surrounds the first sensing element.

In some embodiments, the pyroelectric sensor may further include a second sensing element having a third portion of the first layer of conductive material, a third portion of the layer of pyroelectric material, a third portion of the second layer of conductive material and a second absorption region (e.g., labelled "2" in FIG. 1) coupled to the third portion of the first layer of conductive material. The first layer of conductive material may further define a second gap between the third portion of the first layer of conductive material and the second portion of the first layer of conductive material. In some embodiments, the dummy element surrounds both the first and second sensing elements and may form a super dummy element.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The definitions, as defined and used herein, should be understood to control over dictionary definitions, definitions in documents incorporated by reference and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification, should be understood to mean "either or both" of the elements so conjoined, i.e., elements that are conjunctively present in some case and disjunctively present in other cases.

Use of ordinal terms such as "first," "second," "third," etc., in the claims to modify a claim element does not by itself connotate any priority, precedence, or order of one claim element over another or the temporal order in which acts of a method are performed, but are used merely as labels to distinguish one claim element having a certain name from another claim element having a same name (but for use of the ordinal term) to distinguish the claim elements.

Also, the phraseology and terminology used herein is for the purpose of description and should not be regarded as limiting. The use of "including," "comprising," "having," and variations thereof herein, is meant to encompass the items listed thereafter and equivalents thereof as well as additional items.

What is claimed is:

1. A pyroelectric sensor comprising:

a layer of pyroelectric material having a first surface and a second surface opposite the first surface;

a first layer of conductive material coupled to the first surface of the layer of pyroelectric material, and a second layer of conductive material coupled to the second surface of the layer of pyroelectric material;

a first sensing element comprising a first portion of the first layer of conductive material, a first portion of the layer of pyroelectric material, a first portion of the second layer of conductive material, and a first absorption region coupled to the first portion of the first layer of conductive material; and a dummy element comprising a second portion of the first layer of conductive material, a second portion of the layer of pyroelectric material and a second portion of the second layer of conductive material, wherein the first layer of conductive material defines a first gap between the first portion of the first layer of conductive material and the second portion of the first layer of conductive material.

2. The pyroelectric sensor of claim 1, wherein the dummy element has a reflective top surface, the top surface of the dummy element being opposite the first surface of the layer of conductive material relative to the dummy element.

3. The pyroelectric sensor of claim 1, wherein the dummy element surrounds the first sensing element.

4. The pyroelectric sensor of claim 1, wherein the second portion of the first layer of conductive material is electrically shorted to the second portion of the second layer of conductive material.

5. The pyroelectric sensor of claim 1, wherein the second portion of the first layer of conductive material and the second portion of the second layer of conductive material are connected to a discharge path.

6. The pyroelectric sensor of claim 1, wherein the layer of pyroelectric material comprises Lithium Tantalate, Lithium Niobate or polyvinylidene fluoride.

7. The pyroelectric sensor of claim 1, wherein the layer of pyroelectric material has a resistivity greater than $10^{10}$ $\Omega$-m.

8. The pyroelectric sensor of claim 1, wherein the first gap separates the first portion of the first layer of conductive material from the second portion of the first layer of conductive material by 25 $\mu$m-500 $\mu$m.

9. The pyroelectric sensor of claim 1, further comprising read-out circuitry coupled to the first portion of the first layer of conductive material and the first portion of the second layer of conductive material.

10. The pyroelectric sensor of claim 1, further comprising:

a second sensing element comprising a third portion of the first layer of conductive material, a third portion of the layer of pyroelectric material, a third portion of the second layer of conductive material and a second absorption region coupled to the third portion of the first layer of conductive material, wherein the first layer of conductive material further defines a second gap between the third portion of the first layer of conductive material and the second portion of the first layer of conductive material.

11. The pyroelectric sensor of claim 10, wherein the dummy element surrounds both the first and second sensing elements.

12. The pyroelectric sensor of claim 1, wherein the second layer of conductive material defines a third gap between the first portion of the second layer of conductive material and the second portion of the second layer of conductive material.

13. The pyroelectric sensor of claim 1, wherein the dummy element further comprises a second absorption region coupled to the second portion of the first layer of conductive material, wherein the second portion of the first layer of conductive material is electrically shorted to the second portion of the second layer of conductive material.

14. A pyroelectric sensor comprising:

a layer of pyroelectric material having a first surface and a second surface opposite the first surface;

a first layer of conductive material coupled to the first surface of the layer of pyroelectric material, and a second layer of conductive material coupled to the second surface of the layer of pyroelectric material;

a first sensing element comprising a first portion of the first layer of conductive material, a first portion of the layer of pyroelectric material, a first portion of the second layer of conductive material, and a first absorption region coupled to the first portion of the first layer of conductive material;

a second sensing element comprising a second portion of the first layer of conductive material, a second portion of the layer of pyroelectric material, a second portion of the second layer of conductive material and a second absorption region coupled to the second portion of the first layer of conductive material; and a dummy element enclosing both the first portion of the first layer of conductive material and the second portion of the first layer of conductive material.

15. The pyroelectric sensor of claim 14, wherein the dummy element has a reflective top surface, the reflective top surface of the dummy element being opposite the first surface of the layer of conductive material relative to the dummy element.

16. The pyroelectric sensor of claim 14, wherein the dummy element comprises a third portion of the first layer of conductive material, a third portion of the layer of pyroelectric material and a third portion of the second layer of conductive material.

17. The pyroelectric sensor claim 16, wherein the third portion of the first layer of conductive material is electrically shorted to the third portion of the second layer of conductive material.

18. The pyroelectric sensor of claim 16, wherein the third portion of the first layer of conductive material and the third portion of the second layer of conductive material is connected to a discharge path.

19. The pyroelectric sensor of claim 14, further comprising a second dummy element disposed between the first portion of the second layer of conductive material and the second portion of the second layer of conductive material.

20. The pyroelectric sensor of claim 16, wherein the dummy element further comprises a third absorption region coupled to the third portion of the first layer of conductive material, wherein the third portion of the first layer of conductive material is electrically shorted to the second portion of the second layer of conductive material.

* * * * *